(12) United States Patent
Yang et al.

(10) Patent No.: US 9,516,748 B2
(45) Date of Patent: Dec. 6, 2016

(54) CIRCUIT BOARD, ELECTRONIC MODULE AND ILLUMINATING DEVICE HAVING THE CIRCUIT BOARD, AND METHOD FOR MANUFACTURING THE CIRCUIT BOARD

(71) Applicant: OSRAM GmbH, Munich (DE)

(72) Inventors: Jianghui Yang, Shenzhen Guangdong (CN); Chuanpeng Zhong, Shenzhen Guangdong (CN); Hao Li, Shenzhen Guangdong (CN); Xiaomian Chen, Shenzhen Guangdong (CN)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 14/407,074

(22) PCT Filed: Jun. 14, 2013

(86) PCT No.: PCT/EP2013/062382
§ 371 (c)(1),
(2) Date: Dec. 11, 2014

(87) PCT Pub. No.: WO2013/186364
PCT Pub. Date: Dec. 19, 2013

(65) Prior Publication Data
US 2015/0107882 A1    Apr. 23, 2015

(30) Foreign Application Priority Data

Jun. 14, 2012  (CN) .......................... 2012 1 0199466

(51) Int. Cl.
*H05K 1/05*    (2006.01)
*H05K 1/02*    (2006.01)
(Continued)

(52) U.S. Cl.
CPC ............ *H05K 1/053* (2013.01); *H05K 1/0201* (2013.01); *H05K 1/0203* (2013.01);
(Continued)

(58) Field of Classification Search
CPC ...... H05K 1/053; H05K 1/0284; H05K 1/181; H05K 1/056; H05K 3/10; H05K 2201/10106; H05K 2201/06; H05K 1/0306; H05K 1/0203; H05K 1/0201; H05K 1/0204; H05K 1/021; H05K 2201/068; H05K 2201/10416; H01L 2224/48091; H01L 2224/73265; H01L 2023/4062; Y10T 29/49155
(Continued)

(56) References Cited

U.S. PATENT DOCUMENTS 8,304,292 B1 * 11/2012 Lin ...................... H01L 23/3121
                                                                438/122
2011/0101394 A1 * 5/2011 McKenzie .......... C23C 18/1657
                                                                257/98
2012/0007076 A1    1/2012 Cho

FOREIGN PATENT DOCUMENTS

DE    102010017560 A1    12/2011
EP         2101550 A1      9/2009
JP        H04180689 A      6/1992

OTHER PUBLICATIONS

International Search Report of PCT/EP2013/062382 dated,Oct. 29, 2013.

* cited by examiner

*Primary Examiner* — Ishwarbhai B Patel
(74) *Attorney, Agent, or Firm* — Viering, Jentschura & Partner mbB

(57) ABSTRACT

Various embodiments relate to a circuit board, including a base and a heat-conducting layer. The base has a first region and a second region on one side thereof facing the heat-conducting layer, the first region is recessed with respect to the second region, a first insulating layer is accommodated
(Continued)

in the first region, a second insulating layer is formed on the second region, and the first insulating layer and the second insulating layer have different thermal conductivities. In addition, various embodiments further relate to an electronic module and an illuminating device including such circuit board. Various embodiments also relate to a method for manufacturing such circuit board.

13 Claims, 4 Drawing Sheets

(51) Int. Cl.
| | |
|---|---|
| *H05K 1/18* | (2006.01) |
| *H05K 1/03* | (2006.01) |
| *H05K 3/10* | (2006.01) |
| *H05K 1/14* | (2006.01) |

(52) U.S. Cl.
CPC ......... *H05K 1/0204* (2013.01); *H05K 1/0284* (2013.01); *H05K 1/0306* (2013.01); *H05K 1/056* (2013.01); *H05K 1/181* (2013.01); *H05K 3/10* (2013.01); *H01L 2224/48091* (2013.01); *H01L 2224/73265* (2013.01); *H05K 1/142* (2013.01); *H05K 2201/048* (2013.01); *H05K 2201/06* (2013.01); *H05K 2201/09745* (2013.01); *H05K 2201/10106* (2013.01); *H05K 2201/10416* (2013.01); *Y10T 29/49155* (2015.01)

(58) Field of Classification Search
USPC .... 174/250–268; 361/760, 704–720, 249.01, 361/249.02, 249.11, 373, 294; 257/98–100, 257/779, 789
See application file for complete search history.

CIRCUIT BOARD, ELECTRONIC MODULE AND ILLUMINATING DEVICE HAVING THE CIRCUIT BOARD, AND METHOD FOR MANUFACTURING THE CIRCUIT BOARD

RELATED APPLICATIONS

The present application is a national stage entry according to 35 U.S.C. §371 of PCT application No.: PCT/EP2013/062382 filed on Jun. 14, 2013, which claims priority from Chinese application No.: 201210199466.X filed on Jun. 14, 2012, and is incorporated herein by reference in its entirety.

TECHNICAL FIELD

Various embodiments relate to a circuit board, an electronic module and an illuminating device having the circuit board. In addition, various embodiments further relate to a method for manufacturing the circuit board.

BACKGROUND

In the current illuminating devices, especially in the large-power LED illuminating devices, most of the total thermal resistance of the illuminating device is the thermal resistance of the circuit board. Taking the conventional metal-based circuit board (MCPCB) as an example, heat generated by LED chips that can be regarded as heat sources during operation must be transferred to the base by passing through an electric-conducting layer and an insulating layer that are arranged in sequence on a surface of the metal base, such as on an aluminum base. Since the insulating layer is usually made from polymer, its thermal conductivity is quite low. This leads to relatively big thermal resistance between the LED chips and the metal base. Taking a relatively new ceramic-based circuit board (ceramic PCB) as an example, though heat generated by the LED chips that also can be regarded as heat sources during operation can be transferred to the ceramic base just by passing through an electric-conducting layer arranged on a surface of the ceramic base, due to the restrictions of ceramic, the ceramic base has relatively low thermal conductivity compared with the metal base, such as aluminum base, thus, the whole illuminating device still has high thermal resistance. Moreover, such ceramic-based circuit board is also easily broken or damaged and has a relatively big deadweight.

SUMMARY

Therefore, various embodiments provide a circuit board. The circuit board is easily manufactured and has a low cost and a light weight as well as the advantage of low thermal resistance. Heat generated by an operative electronic component mounted in such circuit board can be quickly conducted to the external environment to realize good heat dissipating effect.

The circuit board in accordance with various embodiments includes a base and an electric-conducting layer, characterized in that the base has a first region and a second region on one side thereof facing the electric-conducting layer, the first region is recessed with respect to the second region, a first insulating layer is accommodated in the first region, a second insulating layer is formed on the second region, and the first insulating layer and the second insulating layer have different thermal conductivities.

Various embodiments arrange regions having different thermal conductivities on the same circuit board such that various electronic components, especially temperature-sensitive components or components generating heat during operation, can be targetedly carried. On one side of the circuit board, since the first insulating layer is accommodated in a form of "body" in the recessed first region, and the second insulating layer is formed in a form of "plane" on the second region, the circuit board in accordance with the present disclosure includes two sections that have quite different thermal conductivities in a direction perpendicular to the first and/or second insulating layer, wherein in the first section including the first insulating layer, the thermal conductivity of this section must be calculated depending upon thermal conductivities of the first insulating layer and the base; and in the second section including the second insulating layer, the thermal conductivity of the second insulating layer, compared with the first insulating layer, has a smaller influence on the thermal conductivity of this section. Such simply-structured circuit board is particularly suited to bear large-power electronic components.

In accordance with various embodiments, the first insulating layer has a higher thermal conductivity than the second insulating layer. Accordingly, the electronic component to dissipate heat can be in thermal contact with the first insulating layer so as to dissipate heat mainly with the aid of the first insulating layer that has a high thermal conductivity.

In accordance with various embodiments, the base is made from a metal. Since metal is characterized by a high thermal conductivity and high rigidity, it is especially suited to be used as base of the circuit board. In addition, as the first and second insulating layers are formed between the electric-conducting layer and the base, the metallicity of the base will not affect the electric-conducting performance of the whole circuit board. The thermal conductivity of the metal base can reach 140-398 K/(W*m). The base herein may be made from a material selected from aluminum, aluminum alloy and copper.

In accordance with various embodiments, the first insulating layer is a ceramic insulating layer. The ceramic insulating layer, for instance, can have a thermal conductivity of 20-39 K/(W*m). In various embodiments, the first insulating layer is made from $Al_2O_3$. The first insulating layer also can be made from AlN, and thus the ceramic insulating layer can have a thermal conductivity of, for example, 150-180 K/(W*m).

In accordance with various embodiments, the second insulating layer is a polymer insulating layer that has a thermal conductivity of usually less than 3 K/(W*m).

In accordance with various embodiments, a joint layer is formed between an inner wall of the first region and the first insulating layer for fixedly connecting the base and the first insulating layer. The base and the first insulating layer are made from different materials and both have high rigidities, thus the additional joint layer must be used to fixedly connect the two together.

In accordance with various embodiments, the joint layer includes solder pads formed on the inner wall and on an outer wall of the first insulating layer facing the inner wall and a solder joining the solder pads. For instance, when the base is made from a metal material and the first insulating layer is configured to be a ceramic body, the ceramic body should be fixed in, e.g. the first region that is defined as a rectangular groove. Solder pads are preset on various surfaces of the ceramic body facing the rectangular groove and various surfaces of the rectangular groove, the solder pads formed oppositely can be soldered together by using the solder, and further the base and the first insulating layer as ceramic body can be welded together.

In accordance with various embodiments, the second region is configured to be flat. The second region can be a top surface of the base, and as an edge region, defines the recessed first region.

In accordance with various embodiments, surfaces of the first insulating layer and the second insulating layer are on the same horizontal plane. Thus, the electric-conducting layer on the first and second insulating layers can be assured to have a flat trend and can fixedly bear an electronic component to be mounted.

In accordance with various embodiments, the first insulating layer and the second insulating layer are fixedly connected through a solder. In a direction parallel to the electric-conducting layer, fixed connection between the first insulating layer and the second insulating layer is assured through welding, and therefore, the electric-conducting layer can be formed simply and safely on surfaces of the first and second insulating layers. In various embodiments, the electric-conducting layer is configured as a printed circuit layer.

In accordance with various embodiments, the electric-conducting layer includes a first electric-conducting layer formed on the first insulating layer and a second electric-conducting layer formed on the second insulating layer. For example, when the thermal conductivity of the first insulating layer is higher than that of the second insulating layer, the electronic component that generates heat in operation can be completely fixed on the first electric-conducting layer and is in electrical connection therewith for effective heat dissipation.

In accordance with various embodiments, the first and second electric-insulating layers are spaced from each other and connected through wires, and any two of the first and second electric-insulating layers are spaced from each other. Since the first and the second insulating layers are connected through the solder, formation of electric-conducting layer on the joint region is particularly avoided for preventing occurrence of, e.g. short circuit.

In accordance with various embodiments, the first electric-conducting layer includes at least two electric-adjoining regions and a heat-adjoining region, wherein any two of the at least two electric-adjoining regions and the heat-adjoining region are spaced from each other. The heat-adjoining region usually formed below the electronic component can directly transfer heat generated by the electronic component to the first insulating layer that has a high thermal conductivity. The two electric-adjoining regions spaced from the heat-adjoining region can be in electrical connection and fixed connection with pins of the electronic component.

In addition, various embodiments further relate to an electronic module including at least one electronic component, characterized by further including the above circuit board for carrying the electronic component.

In accordance with various embodiments, the electronic component has at least two electric-conducting portions and a heat-conducting portion, the at least two electric-conducting portions are in connection with the electric-adjoining regions, respectively, and the heat-conducting portion is in connection with the heat-adjoining region. As a result, heat generated by the electronic component during operation can be transferred through the heat-conducting portion to the heat-adjoining region on the circuit board, while assuring the electronic component to be in electrical connection with the electric-adjoining region on the circuit board, for highly effectively dissipating heat.

In addition, various embodiments further relate to an illuminating device, characterized by including the above electronic module, wherein the electronic component includes LED chips as light sources. By mounting the circuit board according to various embodiments in the illuminating device, heat dissipation can be carried out for high-power LED chips and other electronic parts, thus prolonging the service lifetime of the whole illuminating device.

Various embodiments also provide a method for manufacturing the above circuit board, including:

a) providing a base that has a first region and a second region on one side thereof, wherein the first region is recessed with respect to the second region, b) providing a first insulating layer and a second insulating layer that have different thermal conductivities, wherein the second insulating layer is formed on the second region, and c) forming the first insulating layer on the first region.

In this method, a groove that needs to be particularly formed on one surface of the metal base is used as the first region for accommodating the first insulating layer, and the second insulating layer is formed on remaining surface that is flat with respect to the groove, i.e. on the second region, wherein the first insulating layer and the second insulating layer have different thermal conductivities.

In accordance with various embodiments, prior to c), further included is d) forming an electric-conducting layer on the first insulating layer and the second insulating layer, respectively. In practical manufacturing, the electric-conducting layer can be formed on an individual massive first insulating layer, and moreover, a corresponding electric-conducting layer is formed on the second insulating layer on the second region.

The circuit board manufactured through the method has the advantages that it can highly-effectively and targetedly dissipate heat from the electronic component mounted thereon and has a high rigidity especially suited to bear high-power electronic components.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "inner", "outer", is used in reference to the orientation of the figures being described.

Because components of embodiments of the present invention can be positioned in a number of different orientations, the directional terminology is used for purposes of illustration and is in no way limiting. It is to be understood that other embodiments may be utilized and structural or logical changes may made without departing from the scope of the present invention. The following detailed description, therefore, is not to be taken in a limiting sense, and the scope of the present invention is defined by the appended claims.

Figure 1:
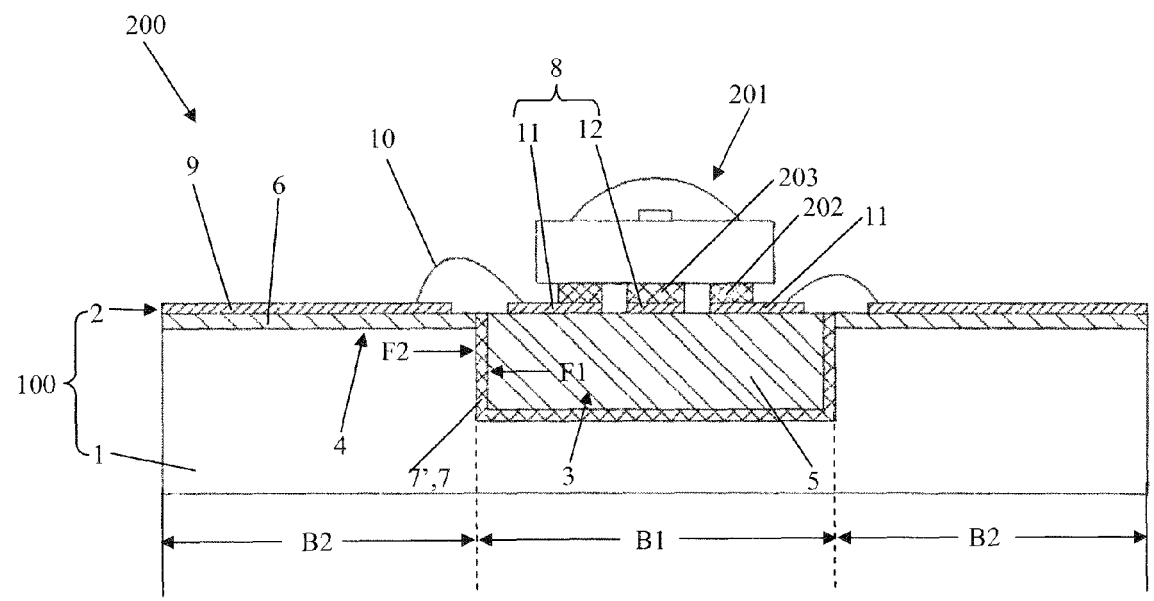
FIG. 1 is a sectional view of a first embodiment of an electronic module in accordance with various embodiments, wherein the circuit board according to various embodiments is included.

It is to be understood that the features of the various exemplary embodiments described herein may be combined with each other, unless specifically noted otherwise FIG. 1 is a sectional view of a first embodiment of an electronic module in accordance with the present disclosure, wherein the circuit board according to the present disclosure is included. In the electronic module 200, a circuit board 100 used to bear an electronic component 201 is configured to have a heat-conducting path with relatively small local thermal resistance for the electronic component 201 to dissipate heat. Specifically, the circuit board 100 includes a metal-made base 1 and an electric-conducting layer 2 configured as a printed circuit layer, and the base 1 has a first region 3 and a second region 4 on one side thereof facing the electric-conducting layer 2, wherein the first region 3 is recessed with respect to the second region 4 to define, e.g. a rectangular groove. A massive first insulating layer 5 that has a high thermal conductivity, for instance, is formed in the first region 3, and a layered second insulating layer 6 is formed on the second region 4. The circuit board 100 thus formed has different thermal conductivities in a direction perpendicular to a cross section: a first section B1 of the ceramic-made first insulating layer 5 has a small thermal resistance, and a second section B2 of the polymer-made second insulating layer 6 has a big thermal resistance.

In order to assure good heat dissipating effect of the electronic module 200, the electronic component 201 that generates heat during operation is fixed on the first section B1 of the circuit board 100, and the heat generated by the electronic component 201 is transferred along to a heat-conducting path "heat-conducting portion 203-heat-adjoining region 12-first insulating layer 5-base 1" that has a small thermal resistance.

The massive ceramic body that has a high thermal conductivity and is used as the first insulating layer 5 is fixed on the first region 3. It can be seen from the sectional view as shown in FIG. 1 that the first insulating layer 5 that has a rectangular cross section, i.e. the ceramic body, is accommodated with a matched shape in the rectangular groove defined by the first region 3. Since the first insulating layer 5 and the base 1 are made from different hard materials, a joint layer must be additionally provided between an outer wall F2 of the ceramic body and an inner wall F1 of the rectangular groove facing the outer wall F2 and is used to fix the first insulating layer 5 that has a big weight and a big volume on the first region 3, i.e. fixed in the base 1.

The joint layer includes solder pads 7' (not shown in the figures) formed in advance on the inner wall F1 and the outer wall F2, respectively, and solder 7. A conductive silver paste herein can be chosen as the solder 7, the non-solid solder 7 is potted into a gap between the ceramic body and the rectangular groove and welds the solder pads 7' on the outer wall F2 and on the inner wall F1 together after it is cured. In this manner, the ceramic body can be fixedly embedded into the rectangular groove and integrated with the base 1. In addition, the solder 7 also connects the first insulating layer 5 and the second insulating layer 6 together.

The electric-conducting layer 2 configured as printed circuit layer includes a first electric-conducting layer 8 formed on the first insulating layer 5 and a second electric-conducting layer 9 formed on the second insulating layer 6. Since the first and second insulating layers 5, 6 are connected by a metal solder 7, in order to prevent short circuit, the electric-conducting layer 2 is not formed on this region, and only wires 10 are used to electrically connect the first and second electric-conducting layers 8, 9. The electronic component 201 that is fixed on the first electric-conducting layer 8, for example, through welding, on one hand, can be in electrical connection with the at least two electric-adjoining regions 11 of the first electric-conducting layer 8 by means of at least two electric-conducting portions configured as pins, and on the other hand, can be in thermal connection with one heat-adjoining region 12 of the first electric-conducting layer 8 by means of the heat-conducting portion below the electronic component 201. Corresponding to the configuration of the electronic component 201, at least two electric-adjoining regions 11 and one heat-adjoining region 12 are spaced from each other.

The first insulating layer 5 in the present embodiment is a ceramic heat-conducting layer made from, e.g. $Al_2O_3$ or AlN. Such insulating layer usually has a thermal conductivity of 20-39 K/(W*m) or 150-180 K/(W*m), thus, apart from good electric-insulating capability, it also can be used for heat transfer. The second insulating layer 6 in the present embodiment is a polymer insulating layer and usually has a thermal conductivity of less than 3 K/(W*m). Such insulating layer has good electric-insulating capability, but substantially cannot be used for heat conduction.

In the present embodiment, surfaces of the first insulating layer 5 and the second insulating layer 6 facing the electric-conducting layer 2 are located on the same horizontal plane; as a result, a flat insulating layer completely covering an upper surface of the metal base 1 can be formed.

In one embodiment not shown, the first region 3 and corresponding first insulating layer 5 also can have other structures, e.g. basin shape and cylindrical shape.

Figure 2A:
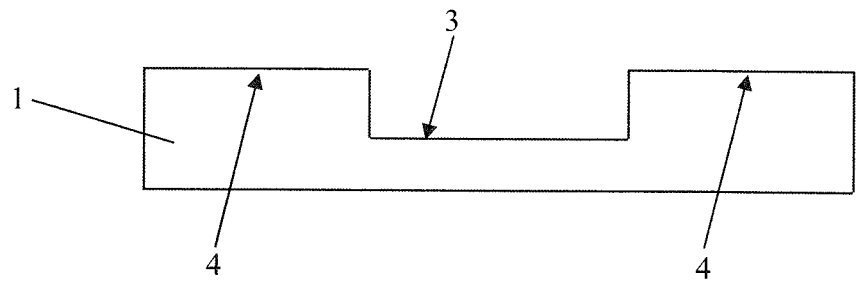
FIGS. 2A-2H are flow charts of manufacturing the circuit board and the electronic module in accordance with various embodiments.
Figure 2B:
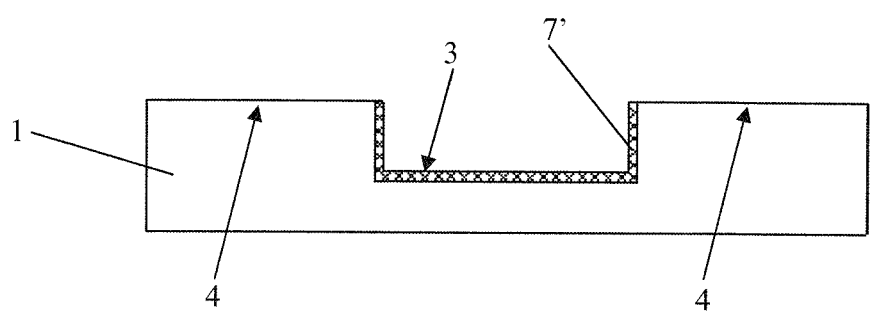
Figure 2C:
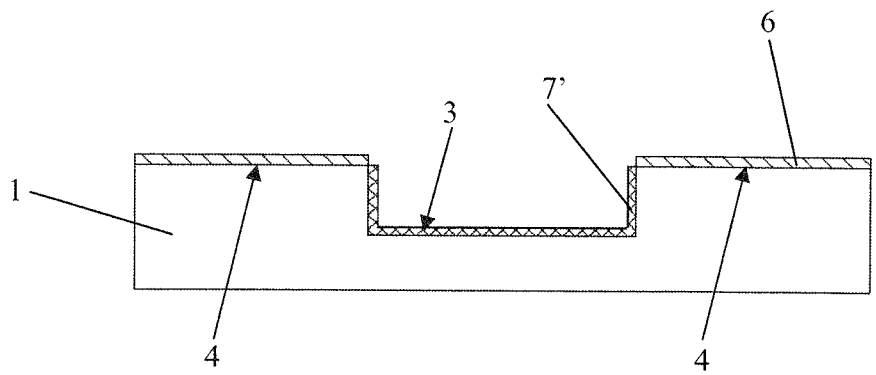
Figure 2D:
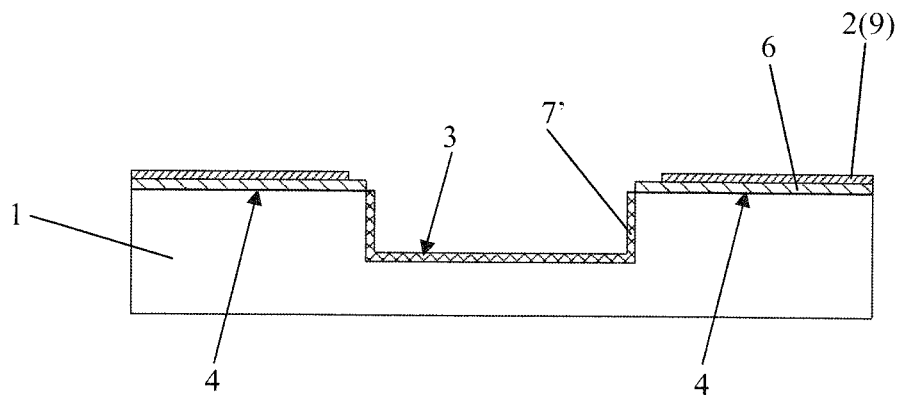
Figure 2E:
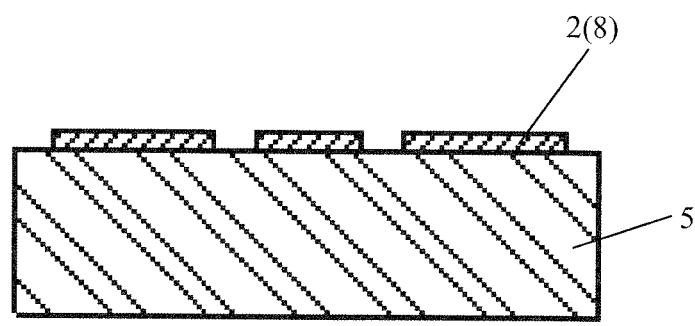
Figure 2F:
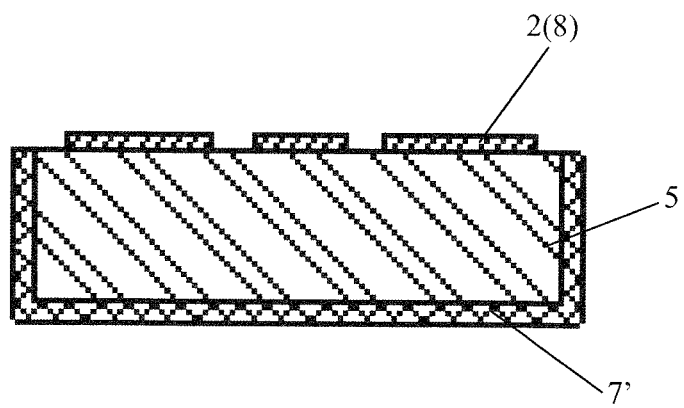

FIGS. 2A-2H show flow charts of a method for manufacturing the circuit board and the electronic module in accordance with the present disclosure, wherein FIGS. 2A-2G show a flow chart of manufacturing the circuit board in accordance with the present disclosure. Steps as shown in FIGS. 2A-2D can be accomplished before, after or at the same time of steps as shown in FIGS. 2E-2F. Firstly a metal base 1 that has a groove with, e.g. a rectangular cross section is provided in FIG. 2A, the first region 3 of the base 1 can be processed through, for instance, a milling process, into a groove with a rectangular cross section. In FIG. 2B a solder pad 7' is made on an inner wall F1 of the groove through, for example, a thick-film circuit process. In FIG. 2C, the second insulating layer 6 formed from polymer in a manner of, e.g. a vacuum laminating, is fixed on the second region 4. Subsequently, the electric-conducting layer 2 is formed on the second insulating layer, as shown in FIG. 2D.

A process of processing the first insulating layer 3 is temporally irrelative to the above steps, as shown in FIG. 2E to FIG. 2F. Firstly, the first insulating layer 5 that can be accommodated in the first region 3 is provided, and it has a massive profile and is made of, for instance, ceramic. The electric-conducting layer 2 is formed on an upper surface of the ceramic block, and subsequently corresponding to the step as shown in FIG. 2B, solder pads 7' are formed on remaining surfaces of the ceramic block, i.e. on the outer wall F2 for welding.

Figure 2G:
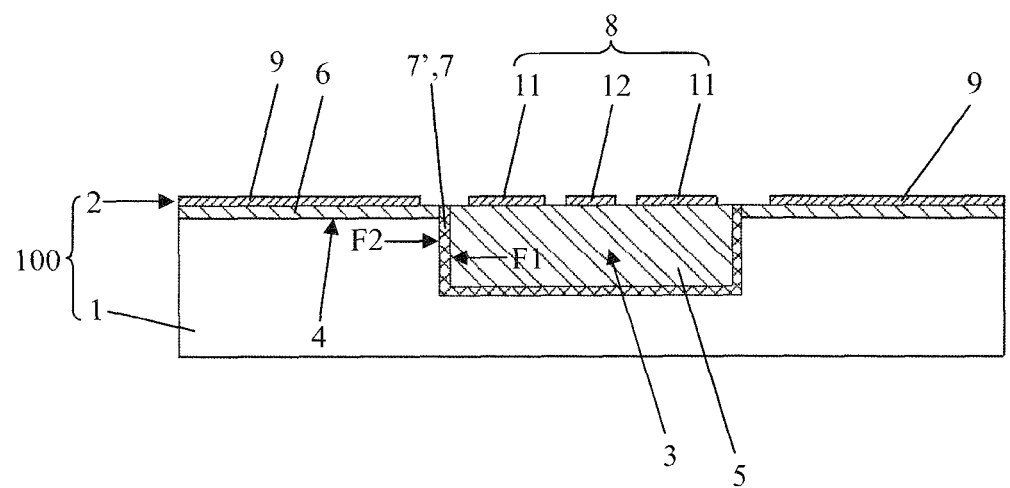

FIG. 2G shows the circuit board 100 having the massive first insulating layer 5 and the second insulating layer 6. The solder 7 is potted between the inner wall F1 and the outer wall F2, and the cured solder 7 and the solder pads 7' formed on the base 1 and the first insulating layer 5 form the joint layer configured to assure the first insulating layer to be fixed in the base 1 and to be in interconnection with the second insulating layer 6.

Figure 2H:
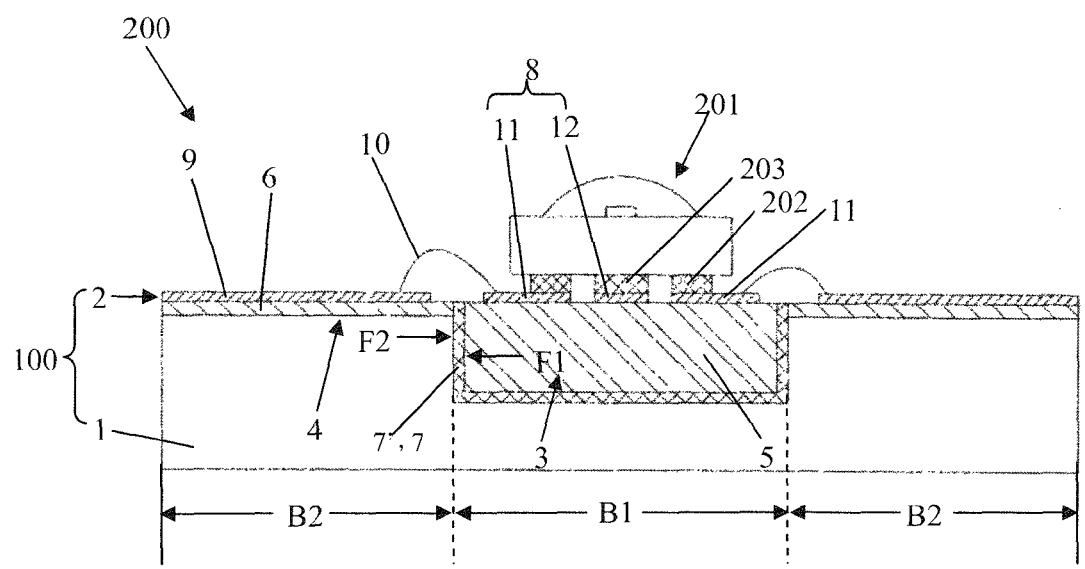

As shown in FIG. 2H, the electronic component 201 can be mounted on the circuit board 100 in accordance with the present disclosure, wherein the electronic component 201 is mounted on the electric-conducting layer 2 located on the first insulating layer 5, i.e. on the first electric-conducting layer 8. Two electric-conducting portions 202 of the electronic component 201 are in connection with the two electric-adjoining regions 11 on the first electric-conducting layer 8, respectively, and the heat-conducting portion 203 of the electronic component 201 is in connection with the heat-adjoining region 12 on the first electric-conducting layer 8. In order to avoid occurrences such as short circuit, gaps are formed between the electric-adjoining regions 11 and the heat-adjoining region 12, and there is also gap between the second electric-conducting layer 9 formed on the second insulating layer 6 and the first electric-conducting layer 8. With the aid of the wires 10, the second electric-conducting layer 9 and the first electric-conducting layer 8 are in electrical connection.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

LIST OF REFERENCE SIGNS

1 base
2 electric-conducting layer
3 first region
4 second region
5 first insulating layer
6 second insulating layer
7 solder
7' solder pad
8 first electric-conducting layer
9 second electric-conducting layer
10 wire
11 electric-adjoining region
12 heat-adjoining region
100 circuit board
200 electronic module
201 electronic component
202 electric-conducting portion
203 heat-conducting portion
B1 first section
B2 second section
F1 inner wall
F2 outer wall

The invention claimed is:

1. A circuit board, comprising
a base and
an electric-conducting layer,
wherein the base has a first region and a second region on one side thereof facing the electric-conducting layer, the first region is recessed with respect to the second region, a first insulating layer is accommodated in the first region, a second insulating layer is formed on the second region, and the first insulating layer and the second insulating layer have different thermal conductivities,
wherein the second region is configured to be flat, and
wherein the first insulating layer and the second insulating layer are fixedly connected through a solder.

2. The circuit board according to claim 1,
wherein that the first insulating layer has a higher thermal conductivity than the second insulating layer.

3. The circuit board according to claim 1, wherein the base is made from a metal.

4. The circuit board according to claim 3, wherein the first insulating layer is a ceramic insulating layer.

5. The circuit board according to claim 4, wherein the second insulating layer is a polymer insulating layer.

6. The circuit board according to claim 3, wherein a joint layer is formed between an inner wall of the first region and the first insulating layer for fixedly connecting the base and the first insulating layer.

7. The circuit board according to claim 6, wherein the joint layer comprises solder pads formed on the inner wall and on an outer wall of the first insulating layer facing the inner wall and a solder joining the solder pads.

8. The circuit board according to claim 3, wherein the base is made from a material selected from aluminum, aluminum alloy and copper.

9. The circuit board according to claim 1, wherein surfaces of the first insulating layer and the second insulating layer are on the same horizontal plane.

10. The circuit board according to claim 1, wherein the electric-conducting layer is configured as a printed circuit layer.

11. The circuit board according to claim 1, wherein the electric-conducting layer comprises a first electric-conducting layer formed on the first insulating layer and a second electric-conducting layer formed on the second insulating layer.

12. The circuit board according to claim 11, wherein the first and second electric-insulating layers are spaced from each other and connected through wires, and any two of the first and second electric-insulating layers are spaced from each other.

13. The circuit board according to claim 12, wherein the first electric-conducting layer comprises at least two electric-adjoining regions and a heat-adjoining region, wherein any two of the at least two electric-adjoining regions and the heat-adjoining region are spaced from each other.

\* \* \* \* \*